(12) United States Patent
Niederberger et al.

(10) Patent No.: US 8,779,858 B2
(45) Date of Patent: Jul. 15, 2014

(54) AMPLIFIER CIRCUIT, DETECTOR ARRANGEMENT AND METHOD FOR OPERATING AN AMPLIFIER

(75) Inventors: Mark Niederberger, Einsiedeln (CH); Vincenzo Leonardo, Wadenswil (CH)

(73) Assignee: ams AG, Unterpremstätten (AU)

( * ) Notice: Subject to any disclaimer, the term of this patent is extended or adjusted under 35 U.S.C. 154(b) by 127 days.

(21) Appl. No.: 13/637,357

(22) PCT Filed: Mar. 3, 2011

(86) PCT No.: PCT/EP2011/053198
§ 371 (c)(1),
(2), (4) Date: Dec. 10, 2012

(87) PCT Pub. No.: WO2011/120757
PCT Pub. Date: Oct. 6, 2011

(65) Prior Publication Data
US 2013/0069719 A1    Mar. 21, 2013

(30) Foreign Application Priority Data
Mar. 30, 2010    (DE) .......................... 10 2010 013 318

(51) Int. Cl.
*H03F 3/08* (2006.01)
(52) U.S. Cl.
USPC .............................. 330/308; 330/85; 330/109
(58) Field of Classification Search
USPC .......................................... 330/308, 85, 109
See application file for complete search history.

(56) References Cited

U.S. PATENT DOCUMENTS

| | | | |
|---|---|---|---|
| 6,141,169 A * | 10/2000 | Pietruszynski et al. | 360/67 |
| 6,404,281 B1 | 6/2002 | Kobayashi | |
| 7,123,098 B2 * | 10/2006 | Bae et al. | 330/308 |
| 7,221,229 B2 * | 5/2007 | Schrodinger | 330/308 |
| 7,876,155 B2 * | 1/2011 | Aroca et al. | 330/260 |
| 8,242,429 B2 * | 8/2012 | Sarpeshkar et al. | 250/214 A |
| 8,445,832 B2 * | 5/2013 | Takemoto et al. | 250/214 A |
| 2005/0052246 A1 | 3/2005 | Visocchi | |
| 2005/0128006 A1 | 6/2005 | Davies | |

FOREIGN PATENT DOCUMENTS

JP      5227104      3/1993

* cited by examiner

*Primary Examiner* — Patricia Nguyen
(74) *Attorney, Agent, or Firm* — McDermott Will & Emery LLP

(57) ABSTRACT

An amplifier circuit comprises a measurement path with an amplifier (1) for providing an output voltage (Vout) depending on a measuring current (Ipd) with a first and a second amplifier input (11, 12), and an amplifier output (13). A return path of the amplifier circuit comprises a first filter (2), an auxiliary amplifier (3) and a second filter (4). In this case, the first filter (2) is designed to filter a DC voltage from the output voltage (Vout) and is connected to the amplifier output (13). The auxiliary amplifier (3) serves to convert an input voltage (Vfil) into an output current (Ifil) and has a first and a second auxiliary amplifier input (31, 32) and an auxiliary amplifier output (33). In this case, the first auxiliary amplifier input (31) is connected to the first filter (2). The second filter (4) is designed to filter noise from the output current (Ifil) and couples the auxiliary amplifier output (33) to the first amplifier input (11).

11 Claims, 2 Drawing Sheets

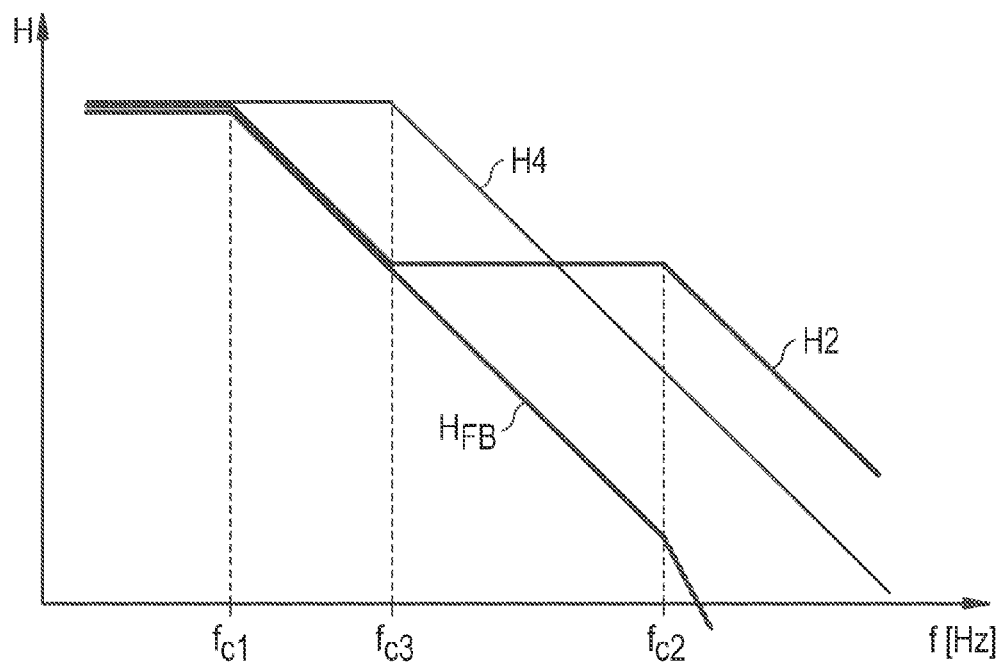

AMPLIFIER CIRCUIT, DETECTOR ARRANGEMENT AND METHOD FOR OPERATING AN AMPLIFIER

The present invention relates to an amplifier circuit, a detector arrangement and a method for operating an amplifier.

Photodiodes are used as sensors in many applications, such as in photoelectric barriers, in optical proximity switches and in infrared (IR) remote controls. In these cases, the high light sensitivity of photodiodes is a desirable feature; however, in many fields of application, it can also present problems. As a rule, a superposition of DC or low-frequency signal components on the actual useful signal occurs. Thus, ambient light from light sources, such as light bulbs or even daylight, can cause certain signals to be superposed on the useful signal without carrying useful information. Such superposed signals, however, increase the requirements to be met by the subsequent signal processing system of the associated measuring circuits. For example, such circuits must have a high dynamic signal range. In addition, suitable measuring circuits must be able to detect the useful signal, which, compared to the superposed signals, is small, and to separate it from the noise that in most cases has signal amplitudes similar to those of the useful signal.

To ensure that circuits for signal processing of a photodiode are kept as simple and compact as possible, a number of different approaches to solving the problem have been proposed. For example, it is possible to use suitable filters to filter out the DC or low-frequency components on the input side and thus ahead of a downstream signal processing system. As a rule, however, approaches of this type are not very effective since, due to the fact that in most cases the circuits must be implemented in the form of integrated circuits, specific basic parameters must be met. For example, in most cases, only a low supply voltage is available, and components of the circuits must be dimensioned accordingly. As a result, they are highly susceptible to noise.

Another approach to the problem uses a transimpedance amplifier and an active feedback of amplified signals. To this end, US 2005/0128006 A1 proposes a transimpedance amplifier with negative active feedback. An output voltage is generated by an amplifier stage as a function of a photoelectric current of a photodiode. The amplifier stage comprises a transimpedance amplifier and an additional amplifier. The output voltage comprises both DC and AC signal components. To compensate for the portion of DC and low-frequency components in the photoelectric current, outputs of the amplifier stage are fed back to the photoelectric current by means of an active feedback loop.

The disadvantage of the proposed approaches to the problem, however, is that signals fraught with noise are added to the input of the amplifier circuit. This is a drawback especially in applications with photodiodes since, compared to the DC signal components, their useful AC signal is generally low and, furthermore, is near the noise level range of the circuit.

Thus, the problem to be solved by the present invention is to make available an amplifier circuit and a method for operation an amplifier circuit that has reduced noise characteristics.

This problem is solved by the subject matters of the independent claims. Embodiments and advanced variants are the subject matter of the dependent claims.

In one embodiment, an amplifier circuit comprises a measurement path with an amplifier which comprises a first and second amplifier input and an amplifier output. The amplifier circuit also comprises a feedback path which comprises a first filter, the auxiliary amplifier and a second filter. The first filter is connected to the amplifier output. The auxiliary amplifier comprises a first and second auxiliary amplifier input and an auxiliary amplifier output. In this case, the first auxiliary amplifier input is connected to the first filter. The second filter couples the auxiliary amplifier output to the first amplifier input.

Using the measurement path of the amplifier circuit, a photoelectric current, for example, of a photodiode that can be connected to the first amplifier input is measured. As a function of this photoelectric current, the amplifier generates an output voltage which, as a rule, comprises both DC and AC components. Using the feedback path, this output voltage is fed back to the first amplifier input. In this case, the first filter has the function of filtering a direct voltage from the output voltage. In this manner, an input voltage that has only reduced voltage components, if any, having the same frequency or a low frequency, is present at the first auxiliary amplifier input. The auxiliary amplifier in turn has the function to convert an input voltage into an output current. An output current thus generated is subsequently fed to the second filter. The second filter in turn has the function to filter noise from the output current. The low-noise current thus filtered is impressed in the form of feedback current into the measurement path and thus onto the first amplifier input.

The first and second filters are preferably tuned to each other. Filter parameters, for example, the cut-off frequency of these filters, determine the relevant transfer functions of the filters. The entire feedback path is characterized by an overall transfer function that can be expressed by means of the transfer functions of the individual filters. The first and second filters are now tuned to each other so as to ensure that they jointly lead to a phase shift which maintains the feedback stable. Phase shifts used are preferably smaller than 180°. Also preferred are phase shifts ranging from 120° to 135°.

By using the first and second filters, the filter characteristics of the amplifier circuit can be improved to advantage. While the first filter has the effect of suitably filtering direct-voltage and low-frequency signal components, the second filter makes it possible to reduce noise components in the feedback current. This prevents noise from being added to the first amplifier input of the amplifier circuit. Since noise of this type is generally of a magnitude comparable to the useful signal of a photodiode circuit, the amplifier circuit can be used to advantage especially in applications with photodiodes.

Furthermore, by combining the first and second filters, an overshoot of the circuit is prevented. If, for example, only the second filter were to be disposed downstream of the auxiliary amplifier, signals above the cut-off frequency of the second filter would drive the amplifier into saturation. By combining the first and second filters, however, such overshoots can be prevented and implemented without signal distortions or any other desirable signal components.

In another embodiment of the invention, the amplifier comprises a transimpedance amplifier.

The advantage of using a transimpedance amplifier is that it makes it possible to accurately measure small currents, such as the photoelectric current. For example, in an operation with a connected photodiode, it is possible to measure a photoelectric current across multiple orders of magnitude proportionally to the intensity of the incident light. By means of their cathode, operated photodiodes are preferably connected to a supply voltage, and by means of the anode, they are connected to a virtual ground and to the first amplifier input of the transimpedance amplifier. Thus, upon incidence of light, a negative output voltage results, and in most cases, a symmetrical supply voltage is not required. In addition, a transimpedance amplifier can be designed so as to be programmable and, by means of suitable switches, can make accessible the measuring range of the photodiode that extends across multiple orders of magnitude.

In another embodiment of the invention, each of the first and second filters comprises a low-pass filter.

In yet another embodiment of the invention, each of the first and second filters comprises an all-pass filter.

In another embodiment of the invention, the second filter has a pole that is selected to ensure that the pole of the second filter can be compensated by a zero point of the first filter.

By using this type of zero-pole compensation, the feedback path is set to ensure that the amplifier circuit remains stable overall. The phase shift of the feedback path is preferably set so that the phase shift is smaller than 180°, preferably in a range from 120° to 135°.

By using the zero-pole compensation, the first and the second filter can preferably be combined to ensure that, on the one hand, DC and low-frequency signal components are filtered out and that, on the other hand, noise can be removed from the filtered feedback current. Another advantage is that by tuning the two filters or their corresponding phase shifts to each other, the amplifier circuit remains stable, thus making it possible to prevent overshoots of the amplifier.

In another embodiment of the present invention, the second filter is coupled to a current source.

In yet another embodiment of the invention, the current source comprises a current mirror which in turn comprises a first and second transistor that are connected to each other by means of their control sides. The second filter is disposed between the first and second transistor of the current mirror and connected to the control sides of the first and second transistor.

In one embodiment of a detector arrangement, the amplifier arrangement is connected via the first amplifier input to a photodiode. If the amplifier circuit includes a current source, the photodiode is preferably located in a common current path with the current source and is supplied by this current source. The current path is present at the auxiliary amplifier output and leads, via the second filter and the current source, to the first amplifier input.

In one embodiment of a method for operating an amplifier, an output voltage is supplied as a function of a photoelectric current. By filtering a direct voltage from the output voltage, a filtered direct voltage is separated. The method further comprises a conversion of the filtered direct voltage into an output current and a separation of a noise-reduced current by filtering noise from the output current. The noise-reduced current is used to compensate for the photoelectric current.

By filtering the direct current and the noise, it is possible to operate the amplifier circuit to advantage and with improved filter properties. While initially direct-voltage and low-frequency signal components are filtered, it is possible, by filtering noise, to generate the noise-reduced current and to use it to compensate for the photoelectric current. This prevents noise from being added to an amplifier input of the amplifier circuit. Since such noise is generally in of a magnitude comparable to the useful signal of a photodiode circuit, the method can be used to advantage, especially in applications with photodiodes.

In addition, the combined filtering prevents an overshoot of the circuit. For example, if only noise were to be filtered, signals above the cut-off frequency of the filter would drive the amplifier into saturation. Instead, by means of the combinations, such overshoots can be prevented and implemented without signal distortions and any other undesirable signal components.

In another embodiment of the invention, the filtering of noise from the output current occurs as a function of the filtering of the direct voltage from the output voltage.

Any type of filtering in an amplifier circuit leads to a characteristic phase shift which can be described by a transfer function. To be able to stably operate the amplifier circuit, it is useful to tune the filtering of noise from the output current as a function of the filtering of the direct voltage from the output voltage to each other in such a manner so as to result in a transfer function which leads to a phase shift that is smaller than 180°, preferably in a range from 120° to 135°.

In yet another embodiment of the invention, the filtering of noise from the output current and the filtering of the direct voltage from the output voltage takes place as a function of transfer functions. At least one zero point of the transfer function of the filtering of the direct voltage corresponds to a pole of the transfer function of the filtering of noise.

Since at least one zero point of the transfer function of the filtering of the direct voltage corresponds to a pole of the transfer function of the filtering of noise, a zero-pole compensation is implemented. As a result, the amplifier circuit is set so that it remains stable overall. The phase shift of the feedback is preferably set so that the phase shift if smaller than 180°, preferably in a range from 120° to 135°. Another advantage is that due to the zero-pole compensation, overshoots of the amplifier can be prevented.

The invention will subsequently be described in greater detail by way of practical examples with reference to figures. Components having the same function and effect are denoted by the same reference symbols. In cases in which components have an identical function, their description will not be repeated for each subsequent figure.

As can be seen:

FIG. 2 shows filter transfer functions of an amplifier arrangement based on the proposed principle.

Figure 1:
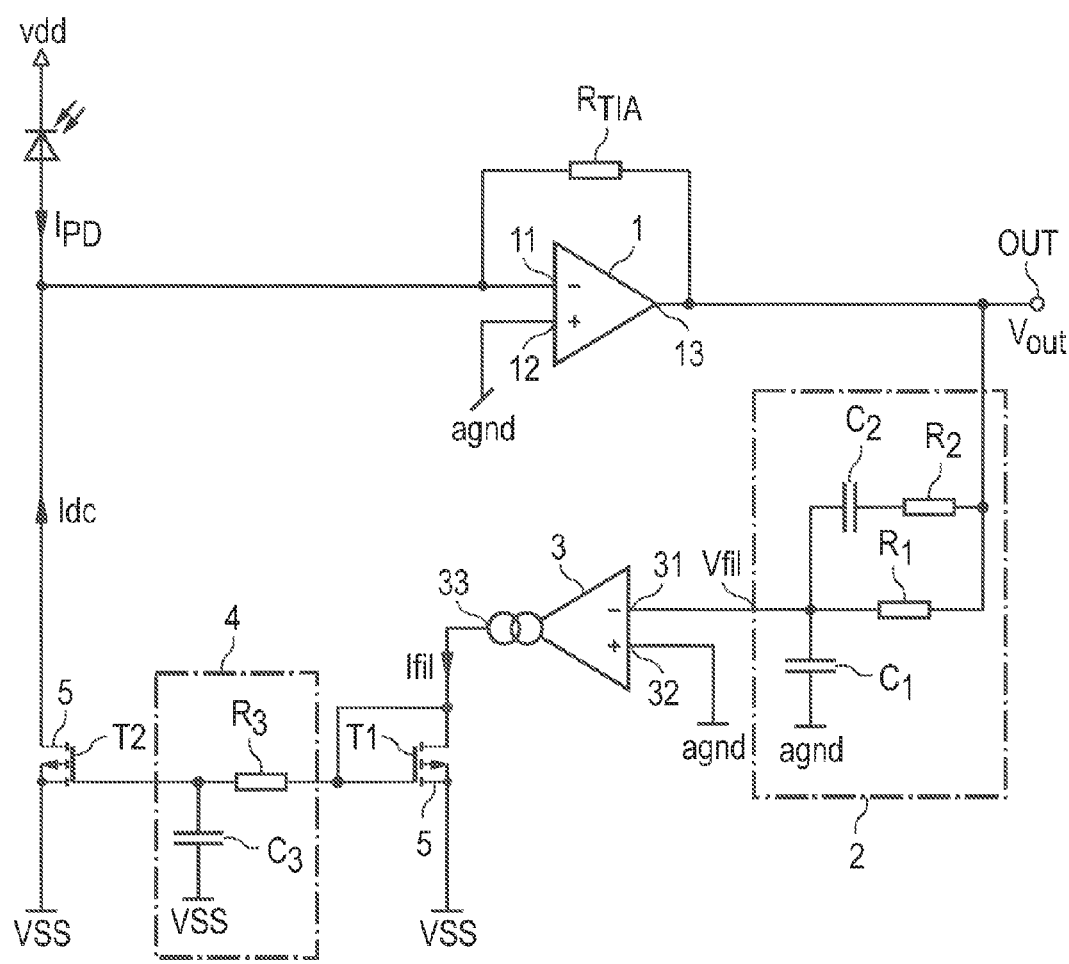
FIG. 1 shows an amplifier arrangement based on the proposed principle.

FIG. 1 shows an amplifier circuit based on the proposed principle. In a measurement path, the amplifier circuit comprises an amplifier 1, the first amplifier input 11 and amplifier output 13 of which are connected to each other by way of a resistor RTIA. At a second amplifier input 12, a potential agnd is present. The amplifier output 13 is connected to an output OUT of the amplifier circuit. A feedback path of the amplifier circuit comprises a first filter 2, an auxiliary amplifier 3, a second filter 4 and a current source 5. The feedback path furthermore connects the output OUT of the amplifier circuit to the first amplifier input 11.

Specifically, the first filter 2 comprises a first and second resistor R1, R2 and a first and second capacitor C1, C2. The first resistor R1 and the first capacitor C1 form an RC element, with the first capacitor C1 being present at the potential agnd. In addition, the first resistor R1 is connected to the output OUT of the amplifier arrangement. Connected in parallel to the first resistor R1, the second resistor R2 and the second capacitor C2 are connected in series. The first resistor R1 and the first capacitor C1 are connected to a first auxiliary amplifier input 31 of the auxiliary amplifier 3. The auxiliary amplifier 3 furthermore comprises a second auxiliary amplifier input 32 that is connected to the potential agnd. An auxiliary amplifier output 33 of the auxiliary amplifier 3 is present at a current source 5. The current source 5 comprises a current mirror made up of a first and a second transistor T1, T2, which transistors, on their load sides, are supplied with voltage with a first supply voltage VSS. The first transistor T1 is connected to the auxiliary amplifier output 33, and the second transistor T2 is connected to the first auxiliary input 11. A connecting branch connects the control sides of the first and second transistors T1, T2. Located in the connecting branch of the current mirror is the second filter 4 which has the form of an RC element. The second filter 4 is furthermore connected to the auxiliary amplifier output 33. Along the connecting branch, the RC element has a third resistor R3 which is connected via a third capacitor C3 to the first supply voltage VSS. In addition, the current mirror is connected to the first amplifier input 11. In addition, a photodiode PD is connected to the current mirror in a common current path with the first amplifier input 11 and the first supply voltage VSS. The current path leads to the first supply voltage VSS via a second supply voltage VDD and the first amplifier input 11 via the second transistor T2.

The photodiode PD, as a function of incident light, generates a photoelectric current Ipd. In combination with the transimpedance amplifier 1, this photoelectric current Ipd is proportional to the intensity of the incident light. As a function of the photoelectric current Ipd, the transimpedance amplifier 1 amplifies the output voltage Vout which is present at the amplifier output 13. The amplification is determined by the resistor RTIA and defined by $$Vout = Ipd \sim RTIA.$$

The output voltage Vout can be picked off at the output OUT of the amplifier voltage and can be fed back to the transimpedance amplifier 1 via the feedback path.

To this end, the output voltage Vout is first filtered through the first filter 2. This is done according to a characteristic transfer function H2 of the first filter 2. The exact form of the transfer function H2 of the first filter is determined by the first and second resistor R1, R2 and by the first and second capacitor C1, C2. Additional details concerning the transfer function of the filters used will be explained with reference to FIG. 2. At the input of the auxiliary amplifier 31, the first filter 2 supplies a filtered output voltage Vfil. The auxiliary amplifier 3 amplifies this filtered output voltage Vfil as a function of the potential agnd that is present at the second auxiliary input 31. The auxiliary amplifier 3 has the function of supplying a filtered output current Ifil from the filtered output voltage Vfil. This output current Ifil is fed to the current mirror and filtered through the second filter 4. The second filter 4 also has a characteristic transfer function H4 of the second filter 4. The exact form of the transfer function H4 of the second filter 4 is determined by the third resistor R3 and the third capacitor C3. The combination of current mirror and the second filter 4 generates a noise-reduced output current Idc which is impressed on the first amplifier input 11.

By using the first and second filters 2, 4, the filter properties of the amplifier circuit can be improved to advantage. While the first filter 2 has the effect of suitably filtering direct-voltage and low-frequency signal components, the second filter 4 makes it possible to reduce noise components in the feedback current. This prevents noise from being added to the first amplifier input 11 of the amplifier circuit. Since noise of this type is generally of a magnitude comparable to the useful signal of a photodiode circuit, the amplifier circuit can be used to advantage especially in applications with photodiodes PD.

Furthermore, the combination of the first and second filters 2, 4, prevents an overshoot of the circuit. If, for example, only the second filter 4 were to be disposed downstream of the auxiliary amplifier 3, signals above the cut-off frequency of the second filter would drive the amplifier into saturation. By combining the first and second filters 2, 4, however, such overshoots can be prevented and implemented without signal distortions or any other desirable signal components.

FIG. 2 shows characteristic transfer functions of the first and second filters 2, 4 of an amplifier arrangement based on the proposed principle. Plotted are transfer functions H as a function of a frequency f measured in Hz.

The first and second filters 2, 4 are tuned to each other. Filter parameters, for example, their cut-off frequency fc1, fc2, fc3, determine the relevant transfer functions of the filters H2, H4, HFB. The entire feedback path is characterized by an overall transfer function HFB which can be expressed by means of the transfer functions H2, H4 of the individual filters. Specifically, the following cut-off frequencies $$fc1 = (2\pi R_1 C_1)^{-1}$$

$$fc2 = (2\pi R_2 C_2)^{-1}$$

result for the first filter 2. These cut-off frequencies are reflected in the transfer function H2 of the first filter 2. At each of the cut-off frequencies fc1, fc2 of the first filter 2, the transfer function H2 has a step. Accordingly, the resulting cut-off frequency fc3 of the second filter 4 is $$fc3 = (2\pi R_3 C_3)^{-1}.$$

Consequently, the transfer function H4 of the second filter has only one step which occurs at the cut-off frequency fc3. Such a single-step transfer function is characteristic for a low-pass filter.

The first and second filters 2, 4 are now tuned to each other in such a manner that they jointly lead to a phase shift which maintains the feedback stability. Phase shifts used are preferably smaller than 180°. Also preferred are phase shifts in a range from 120° to 135°. This can be implemented by selecting the cut-off frequencies fc1, fc2, fc3 and the associated resistors and capacitors R1, R2, R3, C1, C2, C3 in such a manner to ensure that the second filter 4 has a pole and that this pole can be compensated by means of a zero point of the first filter 2. Such a zero-pole compensation is characterized by the following equation:

$$fc3 = (2\pi R_3 C_3)^{-1} = (2\pi R_1 C_2)^{-1} := fc3'.$$

In this equation, fc3' denotes the cut-off frequency of the zero-pole compensation. When this equation is satisfied, an overall transfer function HFB (which is also plotted in FIG. 2) results from the two transfer functions H2, H4 for the entire feedback path. Overall, the overall transfer function HFB has a profile that an individual low-pass filter would have. This leads to the conclusion that a pole of the second filter 4 has been compensated by a zero point of the first filter 2.

The first and second filters 2, 4 are now tuned to each other in such a manner that they jointly lead to an overall transfer function HFB, which corresponds to a low-pass [filter]. The advantage is that this leads to a phase shift that maintains the feedback stable. Phase shifts used are preferably smaller than 180°. Also preferred are phase shifts in a range from 120° to 135°.

LIST OF REFERENCE SYMBOLS

1 Amplifier
11 First amplifier input
12 Second amplifier input
13 Amplifier output
2 First filter
3 Auxiliary amplifier
31 First auxiliary amplifier input
32 Second auxiliary amplifier input
33 Auxiliary amplifier output
4 Second filter 5 Current source
6 Bridging circuit
agnd Potential
fc1 Cut-off frequency
fc2 Cut-off frequency
fc3 Cut-off frequency
fc3' Cut-off frequency
H Transfer junction
H2 Transfer junction of the first filter
H4 Transfer junction of the second filter
HFB Overall transfer junction
I1 Constant current source
I2 Constant current source
I3 Constant current source
Idc Feedback current
Ifil Filtered output current
Ipd Photoelectric current
OUT Output
PD Photodiode
RTIA Resistor
T1 Bridging transistor
T2 Bridging transistor
VDD Second supply voltage
Vfil Filtered output voltage
VSS First supply voltage
Vout Output voltage

What is claimed is:

1. An amplifier circuit comprising:
 a measurement path with an amplifier for supplying an output voltage as a function of a measured current with a first and second amplifier input and an amplifier output; and
 a feedback path which comprises a first filter, an auxiliary amplifier and a second filter, wherein
 the first filter has the function of filtering a direct voltage from the output voltage and is connected to the amplifier output,
 the auxiliary amplifier has the function of converting an input voltage into an output current and comprises a first and second auxiliary amplifier input and an auxiliary output, with the first auxiliary amplifier input being connected to the first filter, and
 the second filter has the function of filtering noise from the output current and couples the auxiliary amplifier output to the first amplifier input.

2. The amplifier circuit as in according to claim 1, wherein the amplifier comprises a transimpedance amplifier.

3. The amplifier circuit according to claims 1 or 2, wherein each of the first and second filters comprises a low-pass filter.

4. The amplifier circuit according to claims 1 or 2, wherein each of the first and second filters comprises an all-pass filter.

5. The amplifier circuit according to claim 1, wherein the second filter has a pole that has been selected to ensure that the pole of the second filter can be compensated by a zero point of the first filter.

6. The amplifier circuit according to claim 1, wherein the second filter is coupled to a current source.

7. The amplifier circuit according to claim 6, wherein
 a current mirror comprises the current source, and
 the second filter is disposed in the connecting branch of the current mirror.

8. A detector arrangement with a photodiode, which
 comprises an amplifier circuit according to claim 1, and in which
 the photodiode is arranged in a common path with the second filter and the path couples the first amplifier input with the second filter.

9. A method for operating an amplifier, comprising:
 supplying an output voltage as a function of a photocurrent;
 separating a filtered direct voltage by filtering a direct voltage from the output voltage;
 converting the filtered direct voltage into an output current;
 separating a noise-reduced current by filtering noise from the output currents; and
 compensating for the photoelectric current by means of the noise-reduced current.

10. A method according to claim 9, wherein filtering of noise from the output current takes place as a function of the filtering of the direct voltage from the output voltage.

11. A method according to claim 10, wherein
 the filtering of noise from the output current and the filtering of the direct voltage from the output voltage takes place as a function of transfer functions, and
 at least one zero point of the transfer function of the filtering of the direct voltage corresponds to a pole of the transfer function of the filtering of noise.

* * * * *